United States Patent
Kaizerman et al.

(10) Patent No.: US 10,312,161 B2
(45) Date of Patent: Jun. 4, 2019

(54) PROCESS WINDOW ANALYSIS

(71) Applicant: Applied Materials Israel Ltd., Rehovot (IL)

(72) Inventors: Idan Kaizerman, Meitar (IL); Yotam Sofer, Givataim (IL)

(73) Assignee: Applied Materials Israel Ltd., Rehovot (IL)

( * ) Notice: Subject to any disclaimer, the term of this patent is extended or adjusted under 35 U.S.C. 154(b) by 509 days.

(21) Appl. No.: 14/666,183

(22) Filed: Mar. 23, 2015

(65) Prior Publication Data

US 2016/0284579 A1    Sep. 29, 2016

(51) Int. Cl.
*H01L 21/66* (2006.01)
*H01J 37/28* (2006.01)
*H01J 37/22* (2006.01)

(52) U.S. Cl.
CPC ............ *H01L 22/12* (2013.01); *H01J 37/222* (2013.01); *H01J 37/28* (2013.01); *H01L 22/20* (2013.01); *H01J 2237/221* (2013.01); *H01J 2237/2817* (2013.01)

(58) Field of Classification Search
CPC ......... H01J 2237/221; H01J 2237/2817; H01J 37/222; H01J 37/28; H01L 22/12; H01L 22/20
USPC .......................................................... 702/81
See application file for complete search history.

(56) References Cited

U.S. PATENT DOCUMENTS

| | | | |
|---|---|---|---|
| 6,902,855 B2 | 6/2005 | Peterson et al. | |
| 7,106,434 B1 * | 9/2006 | Mapoles ............ | G01R 31/2894 356/237.5 |
| 7,570,796 B2 | 8/2009 | Zafar et al. | |
| 2007/0156379 A1 * | 7/2007 | Kulkarni ............. | G06F 17/5045 703/14 |
| 2010/0165134 A1 * | 7/2010 | Dowski, Jr. ............ | B24B 13/06 348/218.1 |
| 2013/0279790 A1 | 10/2013 | Kaizerman et al. | |
| 2013/0279791 A1 | 10/2013 | Kaizerman et al. | |
| 2013/0279794 A1 | 10/2013 | Greenberg et al. | |

(Continued)

OTHER PUBLICATIONS

Kang et al., "Comparative Study of Process Window Identification Methods for 45 nm Device and Beyond," Samsung Electronics Co, 5 pages, Proc. of SPIE vol. 7272 72723D-2.

(Continued)

*Primary Examiner* — Dzung Tran
(74) *Attorney, Agent, or Firm* — Lowenstein Sandler LLP

(57) ABSTRACT

A method for process analysis includes acquiring first inspection data, using a first inspection modality, with respect to a substrate having multiple instances of a predefined pattern of features formed thereon using different, respective sets of process parameters. Characteristics of defects identified in the first inspection data are processed so as to select a first set of defect locations in which the first inspection data are indicative of an influence of the process parameters on the defects. Second inspection data are acquired, using a second inspection modality having a finer resolution than the first inspection modality, of the substrate at the locations in the first set. The defects appearing in the second inspection data are analyzed so as to select, from within the first set of the locations, a second set of the locations in which the second inspection data are indicative of an optimal range of the process parameters.

16 Claims, 3 Drawing Sheets

(56) References Cited

U.S. PATENT DOCUMENTS

| | | | | |
|---|---|---|---|---|
| 2014/0316730 A1* | 10/2014 | Shchegrov | ............... | H01L 22/12 |
| | | | | 702/81 |
| 2014/0347666 A1* | 11/2014 | Veldman | ............... | G01N 21/211 |
| | | | | 356/369 |
| 2015/0046118 A1* | 2/2015 | Pandev | ................... | H01L 22/12 |
| | | | | 702/155 |
| 2015/0054940 A1* | 2/2015 | Shi | ........................ | G06T 7/001 |
| | | | | 348/87 |
| 2015/0228063 A1* | 8/2015 | Minakawa | ............ | H01J 37/244 |
| | | | | 382/151 |

OTHER PUBLICATIONS

Streller et al., "Development and inmplementation of PWQ on patterned wafer darkfield inspection systems," Qimonda GmbH & Co. OHG, 9 pages, Proc. of SPIE vol. 7272 72723J-1.

\* cited by examiner

PROCESS WINDOW ANALYSIS

FIELD OF THE INVENTION

The present invention relates generally to methods and systems used in the manufacture of semiconductor devices, and particularly to optimization of process parameters in such manufacturing.

BACKGROUND

Lithography is a key step in the process of manufacturing semiconductor devices. In this step, radiation is projected through a mask so as to expose a layer of photoresist that has been deposited on the surface of a wafer. The pattern that is printed on the photoresist in this manner serves as a masking layer in forming circuit features on the wafer. Defects that may occur in the lithographic process are thus likely to cause defects in the corresponding circuit elements.

As the dimensions of integrated circuits decrease and patterns become more complex, defects and marginality in the features formed by lithography become increasingly problematic. To avoid (or at least minimize) defects in the integrated circuit device, the lithographic parameters, such as focal adjustment and exposure level, must be set precisely to the optimal values. The set of parameters that gives the best results, i.e., the smallest number of critical defects and the highest yield, is referred to as the "process window," and systematic techniques for choosing these parameters are referred to generally as process window qualification.

Various methods for process window qualification have been described in the patent literature. For example, U.S. Pat. No. 6,902,855 describes a method of determining the presence of an anomaly in qualifying a pattern, patterning process, or patterning apparatus used in the fabrication of microlithographic patterns. Practicing this method on test wafers is said to enable the identification of spatial areas where a process will fail first and candidate regions for carrying out defect inspection and metrology.

Design information may be applied in analyzing the inspection data collected for the purpose of process window qualification. For example, U.S. Pat. No. 7,570,796, whose disclosure is incorporated herein by reference, describes methods and systems for utilizing design data in combination with inspection data, in which defects detected on a wafer are binned by comparing portions of design data proximate positions of the defects in design data space.

SUMMARY

Embodiments of the present invention that are described hereinbelow provide methods, systems and software for analyzing inspection data, which can be useful particularly in process window analysis and qualification.

There is therefore provided, in accordance with an embodiment of the present invention, a method for process analysis, which includes acquiring first inspection data, using a first inspection modality, with respect to a substrate having multiple instances of a predefined pattern of features formed thereon by a fabrication process in which different, respective sets of process parameters are applied in forming different ones of the instances. The first inspection data are processed so as to identify defects at respective locations in the instances of the pattern, and characteristics of the defects identified in the first inspection data are analyzed so as to select a first set of the locations in which the first inspection data are indicative of an influence of the process parameters on the defects. Second inspection data are acquired using a second inspection modality having a finer resolution than the first inspection modality, of the substrate at the locations in the first set. The defects appearing in the second inspection data are analyzed so as to select, from within the first set of the locations, a second set of the locations in which the second inspection data are indicative of an optimal range of the process parameters.

Typically, the pattern is formed on the substrate in accordance with a predefined design, and the method includes setting the process parameters for fabrication of devices in accordance with the design based on the selected second inspection data. The substrate typically includes a semiconductor wafer, and the fabrication process includes lithographic patterning of the semiconductor wafer, and the instances of the predefined pattern include dies defined by the lithographic patterning. The process parameters may include a focal adjustment and an exposure level applied in the lithographic patterning.

In a disclosed embodiment, the first inspection modality is an optical imaging modality, and the second inspection modality is an electron imaging modality.

In some embodiments, analyzing the characteristics of the defects includes clustering the defects into a plurality of bins corresponding to the respective locations of the defects in the instances of pattern, sorting the bins so as to prioritize the bins that are indicative of an influence of the process parameters on the defects, and selecting the first set of the locations from among the prioritized bins. Typically, the pattern is formed on the substrate in accordance with a predefined design, and clustering the defects includes defining the bins responsively to respective features of the design occurring in the bins. Additionally or alternatively, sorting the bins includes identifying a correlation in one or more of the bins between changes in at least one of the process parameters and the defects in the one or more of the bins, and prioritizing the one or more of the bins responsively to the identified correlation.

In a disclosed embodiment, analyzing the characteristics of the defects includes computing for the defects corresponding values of a utility function that are indicative of an information content of the first inspection data at the respective locations of the defects, and selecting the first set of the locations in response to the values of the utility function.

There is also provided, in accordance with an embodiment of the present invention, a method for process analysis, which includes acquiring inspection data with respect to a substrate having features formed thereon, and processing the inspection data so as to identify a set of defects at respective locations on the substrate. For the defects in the set, corresponding values of a utility function are computed. These values are indicative of an information content of the inspection data at the respective locations of the defects. A defect from the set is selected in response to the values of the utility function. In an iterative process, the selected defect is removed from the set, the corresponding values of the utility function are recomputed, and another defect is selected in response to the values of the recomputed utility function until a specified number of the defects have been selected. The respective locations of the selected defects are then outputted.

Typically, the features include multiple instances of a predefined pattern of features formed thereon by a fabrication process in which different process parameters are applied in forming different ones of the instances, and outputting the respective locations includes providing an indication of an optimal range of the process parameters.

Computing the corresponding values of the utility function may include evaluating the information content of the inspection data with respect to the process parameters.

Additionally or alternatively, processing the inspection data includes classifying the defects into a plurality of classes, wherein computing the corresponding values of the utility function includes calculating an uncertainty of classification of the defects.

In disclosed embodiments, the inspection data include at least one image.

There is additionally provided, in accordance with an embodiment of the present invention, a system for process analysis, which includes a first inspection machine, which is configured to acquire first inspection data, using a first inspection modality, with respect to a substrate having multiple instances of a predefined pattern of features formed thereon by a fabrication process in which different, respective sets of process parameters are applied in forming different ones of the instances. A second inspection machine is configured to acquire second inspection data with respect to the substrate, using a second inspection modality having a finer resolution than the first inspection modality. A processor is configured to process the first inspection data so as to identify defects at respective locations in the instances of the pattern, to analyze characteristics of the defects identified in the first inspection data so as to select a first set of the locations in which the first inspection data are indicative of an influence of the process parameters on the defects, and to cause the second imaging machine to acquire the second inspection data at the locations in the first set. The processor is configured to analyze the defects appearing in the second inspection data so as to select, from within the first set of the locations, a second set of the locations in which the second inspection data are indicative of an optimal range of the process parameters.

There is further provided, in accordance with an embodiment of the present invention, a system for process analysis, including an inspection machine, which is configured to acquire inspection data with respect to a substrate having features formed thereon. A processor is configured to process the inspection data so as to identify a set of defects at respective locations on the substrate, to compute for the defects in the set corresponding values of a utility function that are indicative of an information content of the inspection data at the respective locations of the defects, to select a defect from the set in response to the values of the utility function, and to iteratively remove the selected defect from the set, recompute the corresponding values of the utility function, and select another defect in response to the values of the recomputed utility function until a specified number of the defects have been selected for output.

There is moreover, provided, in accordance with an embodiment of the present invention, a process window analyzer, including a memory, which is configured to receive first inspection data, acquired using a first inspection modality, with respect to a substrate having multiple instances of a predefined pattern of features formed thereon by a fabrication process in which different, respective sets of process parameters are applied in forming different ones of the instances, and to receive second inspection data with respect to the substrate, acquired using a second inspection modality having a finer resolution than the first imaging modality. A processor is configured to process the first inspection data so as to identify defects at respective locations in the instances of the pattern, to analyze characteristics of the defects identified in the first inspection data so as to select a first set of the locations in which the first inspection data are indicative of an influence of the process parameters on the defects, and to cause the second inspection machine to acquire the second inspection data at the locations in the first set. The processor is configured to analyze the defects appearing in the second inspection data so as to select, from within the first set of the locations, a second set of the locations in which the second inspection data are indicative of an optimal range of the process parameters.

There is furthermore provided, in accordance with an embodiment of the present invention, a computer software product, including a non-transitory computer-readable medium in which program instructions are stored, which instructions, when read by a computer, cause the computer to receive first inspection data, acquired using a first inspection modality, with respect to a substrate having multiple instances of a predefined pattern of features formed thereon by a fabrication process in which different, respective sets of process parameters are applied in forming different ones of the instances, and to receive second inspection data with respect to the substrate, acquired using a second inspection modality having a finer resolution than the first inspection modality. The instructions cause the computer to process the first inspection data so as to identify defects at respective locations in the instances of the pattern, to analyze characteristics of the defects identified in the first inspection data so as to select a first set of the locations in which the first inspection data are indicative of an influence of the process parameters on the defects, and to cause the second inspection machine to acquire the second inspection data at the locations in the first set. The instructions cause the computer to analyze the defects appearing in the second inspection data so as to select, from within the first set of the locations, a second set of the locations in which the second inspection data are indicative of an optimal range of the process parameters.

The present invention will be more fully understood from the following detailed description of the embodiments thereof, taken together with the drawings in which:

DETAILED DESCRIPTION OF EMBODIMENTS

Overview

Figure 1:
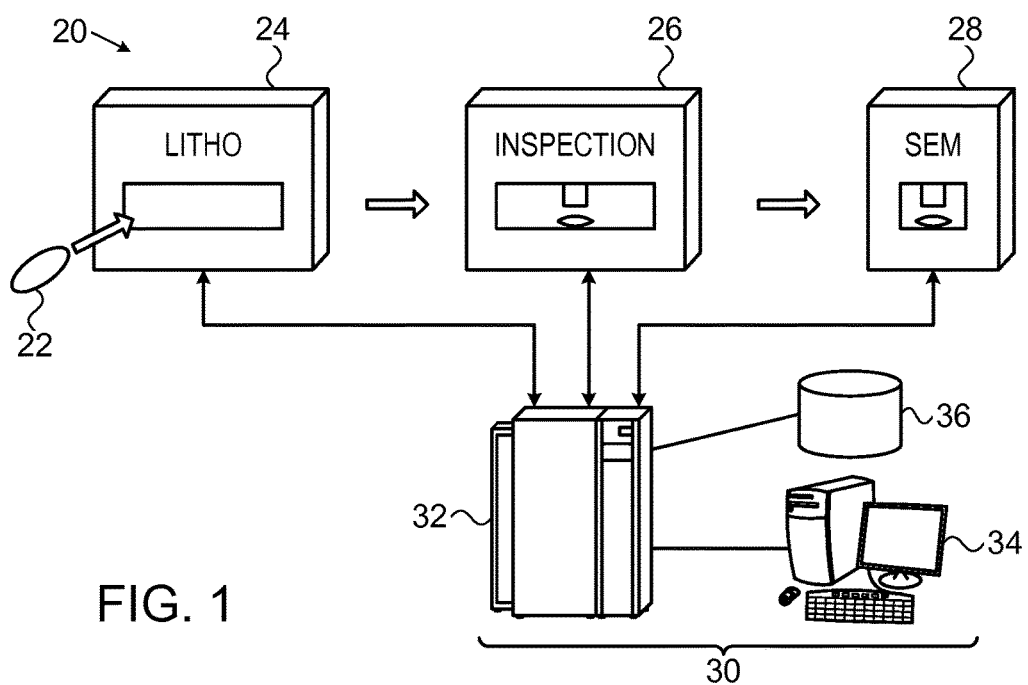
FIG. 1 is a schematic, pictorial illustration of a system for process window qualification, in accordance with an embodiment of the present invention.

Process window qualification (PWQ) techniques commonly use a test sample, comprising a substrate on which multiple instances of a predefined pattern of features are formed using the target fabrication process. Different, respective sets of process parameters applied in forming the different pattern instances. Specifically, in PWQ for semiconductor wafer processing, the substrate is the wafer, and the instances of the predefined pattern are dies defined by the process of lithographic patterning in accordance with the design of a target device. Different sets of lithographic parameters, such as different values of focal adjustment and/or exposure level, are applied to the different dies. The resulting wafer is known as a "focus/exposure matrix" (FEM).

In general, the optimal process window will differ among different devices, depending on the details of the design and processes used in fabrication. It is therefore often necessary to review the entire FEM wafer in order to find the process window that will give an acceptable number and types of defects. A FEM wafer, however, contains a tremendous amount of detail and will typically contain many defects of various different types. These defects will most commonly occur at locations in dies at which the process parameters are outside or near the borders of the desired process window; but certain defects may occur, as well, even in dies that turn out to be inside the process window.

Ideally, all of the defects in the FEM wafer should be identified, classified, and taken into account in setting the process window. In practice, however, such exhaustive evaluation would require an unreasonable expenditure of time and resources. Therefore, one of the key challenges of PWQ is to apply inspection and computing resources selectively, to identify and classify critical locations on the FEM wafer, i.e., locations that are likely to be most informative with respect to the process parameters and their influence on creation (or avoidance) of defects. Images of these selected locations may then be analyzed in detail, at high resolution, and the process parameters for fabrication of the target device may then be determined based on these selected images.

Some embodiments of the present invention that are described herein address this challenge by applying two different modalities of wafer inspection, and analysis of the inspection data provided by these modalities, in two successive stages. The inspection modalities may comprise imaging modalities, such as optical and/or electron imaging, and the inspection data may thus comprise image data. Alternatively or additionally, however, the principles of the embodiments described herein may be applied using information and attributes extracted from other sorts of inspection modalities and data.

Initially, first inspection data, in the form of a first image, for example, are captured using a first inspection modality, with respect to a substrate, such as a FEM wafer, having multiple instances of a predefined pattern of features formed thereon by a fabrication process in which different, respective sets of process parameters are applied in forming different instances. A computer processes the first inspection data to identify defects at various locations and to analyze the characteristics of these defects in order to select a set of locations that appear to be indicative of the influence of the process parameters on the defects. A second inspection modality, having a finer resolution than the first inspection modality, is then applied to acquire second inspection data (such as further images) with respect to the substrate at the locations in the selected set. The computer analyzes the defects appearing in the second inspection data so as to select a subset of the locations that are indicative of the optimal range of the process parameters.

For example, an optical imaging modality may first be applied to the entire substrate (i.e., the entire FEM) in order to identify critical locations, and an electron imaging modality, such as scanning electron microscopy, may then be applied to the locations identified by optical imaging. (Alternatively, an optical inspection tool with higher resolution than the first optical inspection tool could be used in the second stage instead of the scanning electron microscope.) A scanning electron microscope (SEM) has finer resolution than optical imaging, but its operation is time-consuming and costly. Optical imaging is fast enough to apply to the entire wafer.

Thus, the optical image of the FEM wafer may be acquired and analyzed in order to select the first set of critical locations. SEM images are then acquired only at these locations, and the SEM images are processed further in order to re-sort and select the subset of the locations for use in actually setting the process window. The results of the SEM imaging and analysis may be processed automatically in order to choose the optimal process window. Additionally or alternatively, these results may be presented to a human operator for use in setting the process parameters.

Typically, the disclosed embodiments make use of design information in analyzing the images (or other inspection data) and selecting the locations to consider in setting the process window. This sort of technique is referred to generally as design-based binning. For this purpose, the computer clusters the defects into bins corresponding to the respective locations of the defects in the instances of pattern, taking into account the features of the design of the target device that occur at these locations. The computer sorts the bins so as to prioritize those bins that are particularly indicative of the influence of the process parameters on defects in the FEM wafer at the corresponding locations. For example, the computer may identify a correlation in a certain bin between changes in a process parameter over a set of the dies and the appearance of defects in the bin from die to die. In this case, the bin will be prioritized as an exemplar of the influence of the parameter in question. The computer selects the locations that are to be passed for further imaging and analysis from among the prioritized bins.

As noted earlier, for purposes of further inspection and analysis, the computer attempts to select the locations on the FEM wafer that will yield the most useful information regarding the influence of the process parameters on the occurrence of defects in the pattern. For this purpose, the computer may calculate, for each defect location under consideration, a utility function that is indicative of the information content of the inspection data at this location. In some embodiments, the utility function is calculated iteratively over a set of defects under consideration, such that in each iteration, the defect found to have the highest utility is selected and removed from the set. The computer then recomputes the corresponding values of the utility function for the remaining defects, selects the next defect, and proceeds in this manner until a specified number of the defects have been selected for further processing and/or output.

The embodiments described hereinbelow relate specifically to process window analysis for use in semiconductor device manufacture, and to the use of optical and SEM imaging tools in such analysis. The principles of the present invention, however, may similarly be applied using other inspection modalities and in the production of complex structures of other types, on wafers or on other sorts of substrates. Such alternative applications are also considered to be within the scope of the present invention.

System Description

FIG. 1 is a schematic, pictorial illustration of a system 20 for process window qualification (PWQ), in accordance with an embodiment of the present invention. A lithography machine 24 forms a FEM on a substrate, such as a wafer 22.

Typically, in this step, the lithography machine uses a mask created in accordance with computer-aided design (CAD) data, as is known in the art, to form multiple dies on wafer 22, each with a copy of the pattern. The pattern on each die is formed with its own set of process parameters, such as focus and exposure settings, which vary over the wafer. Detailed methods for creating a suitable FEM of this sort are known in the art and are beyond the scope of the present invention.

A first imaging machine 26 forms and processes an optical image of patterned wafer 22. An "optical" image, in the context of the present description and in the claims, means an image formed using visible, infrared, or ultraviolet radiation. Machine 26 may comprise, for example, a UVision® optical inspection system, produced by Applied Materials, Inc. (Santa Clara, Calif.). Alternatively, any other suitable inspection machine may be used at this stage, as long as it is capable of acquiring inspection data with respect to wafer 22 with sufficient speed and resolution. The inspection data may comprise images or other information, which may take the form, for example, of a set of descriptors and/or parameters with respect to the inspected locations.

A second imaging machine 28 is used to form high-resolution images of locations selected based on the image acquired by imaging machine 26. Machine 28 may comprise, for example, a SEM such as a SEMVision™ defect analysis system, likewise produced by Applied Materials, Inc.

A process window analyzer 30 processes the images captured by machines 26 and 28 in order to select the image locations that are considered to be of greatest relevance for PWQ. Analyzer 30 is typically built on a general-purpose computer, comprising a processor 32 with a user interface 34 and a memory 36, as are known in the art, with suitable data links to the other elements of system 20. Although analyzer 30 is shown and described here as a single unit, the processing functions described herein may alternatively be distributed among multiple computers and/or multiple processors, and the terms "computer" and "processor" as used in the present description and in the claims should be understood as including multi-computer and multi-processor implementations. Typically, processor 32 is programmed in software to carry out the functions that are described herein. This software may be downloaded to processor 32 in electronic form, over a network, for example. Additionally or alternatively, the software may be stored on non-transitory computer-readable media, such as optical, magnetic, or electronic memory. Further alternatively or additionally, at least some of the functions of processor 32 may be carried out by programmable or hard-wired logic.

As will be described in greater detail hereinbelow, analyzer 30 stores CAD data in memory 36 with respect to the pattern that is formed by lithography machine 24 on the dies of wafer 22, and applies the CAD data in processing the images acquired by imaging machines 26 and 28. Based on the CAD data and the image acquired by imaging machine 26, processor 32 identifies and analyzes characteristics of defects in the image and thus selects a set of locations on wafer 22 that appear to be particularly indicative of the influence of the process parameters of lithography machine 24 on the defects. Processor 32 then instructs imaging machine 28 to acquire high-resolution images of wafer 22 at these locations.

Processor 32 identifies and analyzes the defects appearing in these latter images in order to select a subset of the defect locations that are most indicative of the bounds of the optimal process window. Analyzer 30 outputs these images, along with relevant analysis and process data, via user interface 34 for consideration by an operator of system 20 in setting production parameters for lithography machine 24. Additionally or alternatively, processor 32 may, on the basis of the images and associated data, autonomously recommend or even set the production parameters.

Methods for Process Window Analysis

Figure 2:
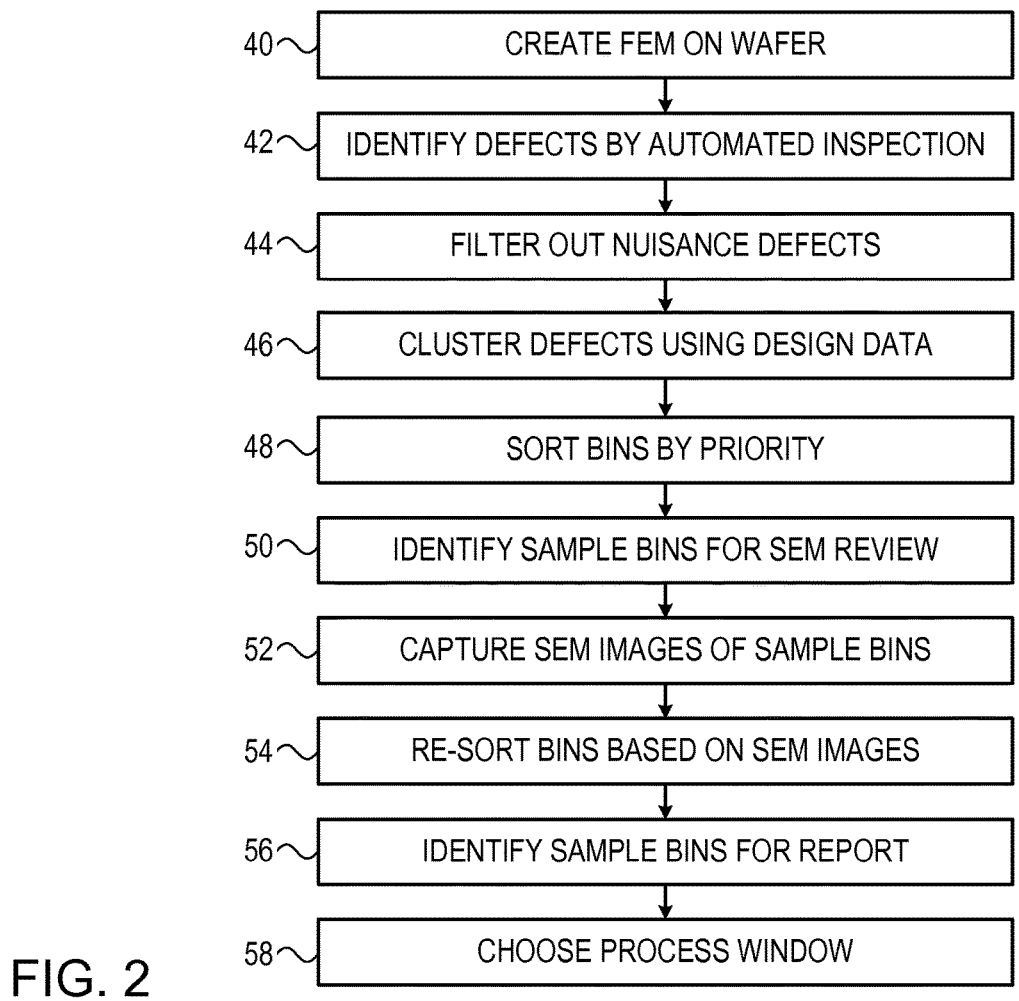
FIG. 2 is a flow chart that schematically illustrates a method for process window qualification, in accordance with an embodiment of the present invention.

FIG. 2 is a flow chart that schematically illustrates a method for process window qualification, in accordance with an embodiment of the present invention. This method is described, for the sake of convenience and clarity, with reference to the elements of system 20, as described above. Alternatively, the method may be implemented in other system configurations, and particularly using other types of imaging machines that are known in the art.

The method begins with preparation of a suitable test wafer, at a sample preparation step 40. At this step, lithography machine 24 prints the target pattern on multiple dies of wafer 22 with different combinations of focal adjustment and exposure settings on different dies, thus creating a focus/exposure matrix (FEM), as is known in the art. This wafer is inserted into inspection machine 26, which acquires an image of the FEM wafer, at a defect detection step 42. Typically, the image acquired at this step is an optical image of the entire FEM, or at least large parts of it. Inspection machine 26 and/or analyzer 30 processes this image in order to identify defects in the pattern. These defects may include, for example, locations where as the result of non-optimal focus and exposure settings, structures on the wafer either extend beyond their expected bounds or do not reach their expected bounds, thus creating potential short circuits and open circuits.

In order to choose defects of potential value in analysis of the process window, processor 32 eliminates "nuisance defects" from further consideration, at a nuisance filtering step 44. Nuisance defects in this context are those that are considered not to be relevant to analysis of the lithographic process window. Particle defects may fall into this category, for example.

Analyzer 30 applies design (CAD) data with respect to the pattern on the wafer in clustering the defects, at a clustering step 46. This sort of clustering is referred to as design-based binning (DBB): Processor 32 clusters defects into groups, referred to as bins, such that all of the defects in any given bin are situated on a similar CAD pattern within the die, and associates each bin with the type of design feature occurring in the corresponding location, as indicated by the CAD data. Bins containing the same sort of design feature may be grouped together at this stage.

Based on the detected defects and the bins in which they are located, processor 32 prioritizes the bins, at a bin sorting step 48. The purpose of this step is to rank the bins by their respective likelihood of providing useful input in choosing settings of the process parameters. For this purpose, processor 32 may compare the appearance of defects in a given bin over multiple dies of the FEM, as a function of the modulation of the process parameters over those dies. In particular, the processor may seek correlations between changes in the appearance of defects in a given bin over multiple dies and the variations in values of the process parameters over the same dies. For example, if the occurrence or severity of defects in a given bin over a set of dies increases monotonically with the change in a given process parameter over this set of dies, then it is likely that the defects in question are the result of changes in the parameter settings. On the other hand, defects whose appearance over such groups of bins does not change, or changes in a manner that is not correlated with changes in the process parameters, are likely to be of less relevance. Thus, at step 48, processor 32 may sort the bins according to correlations of this sort between defects and process parameters. Moreover, in this step processor 32 may generate a preliminary process window based on the correlation analysis. This preliminary process window is a rough estimation, and will be refined in subsequent steps, as described below.

Working from the sorted list of bins and the preliminary process window, processor 32 selects a set of defect locations for further review, at a sampling step 50. For example, processor 32 may choose only a certain number of the locations that received high ranks at step for processing at step 50. Additionally or alternatively, processor 32 may factor the ranking from step 48 into the selection may at step 50.

To select the locations at step 50, processor 32 computes values of a utility function that are indicative of the information content of the defects at the respective locations, based on the correlation between the defects and the modulation of process parameters (according to die and bin within the die), and selects the locations having the highest utility. The information of relevance in this case is the extent to which each evaluated location is indicative of the edges of the process window and the confidence for each die to be within or outside the process window. In other words, the utility function is defined such that locations that are marginal in terms of process settings—i.e., at which the appearance of the defects indicates that the corresponding bins are neither squarely inside nor far outside the process window—will generally have the highest utility values. The utility values may be computed and updated iteratively, so that each selected location is the one that gives the highest utility given the locations and defects that were selected before it. Details of this computation and selection process are presented in FIG. 3.

Wafer 22 is now passed to imaging machine 28 for high-resolution inspection, at a sample imaging step 52. As noted earlier, the images acquired at this step may be electron images, such as SEM images, although other high-resolution imaging modalities may alternatively be used, such as a high-resolution optical inspection machine. Typically, at step 52, imaging machine 28 scans only the sample locations that were selected at step 50. Analyzer 30 processes the images acquired by imaging machine 28 in order to identify and classify the defects that appear in them. Because of the superior resolution of imaging machine 28, the defect classifications achieved at step 52 are generally more accurate and reliable than those found in the optical image at step 42, and provide greater confidence regarding the relationship between given defects, the modulation of process parameters, and the CAD structure to which they belong. Methods that may be used at this step are described, for example, in U.S. Patent Application Publications 2013/0279794, 2013/0279790 and 2013/0279791, whose disclosures are incorporated herein by reference.

Based on the defect classification results, processor 32 prioritizes the bins that were inspected at step 52, at a bin re-sorting step 54 and produces a finer process window. Working from this new sorted list of bins, processor 32 selects the final set of defect locations to be used for final review and setting of the process parameters, at a re-sampling step 56. In general, steps 54 and 56 may use criteria and computational methods similar to those applied at steps and 50, as described above, with changes as appropriate in view of the different imaging parameters and classification information that is available.

The sample bins selected at step 56 are typically presented in a report to an operator of system 20, with a suitable image of each sample bin and values of the process parameters that were used in producing the corresponding die in the FEM. The report may also include recommended process settings or a range of such settings, based on automated analysis of the sample bins by processor 32. Based on this report, the process parameters to be used in producing the target design are chosen, at a process window setting step 58. The choice may be made automatically by analyzer 30 or manually by the system operator, or by a combination of automated and manual functions.

Figure 3:
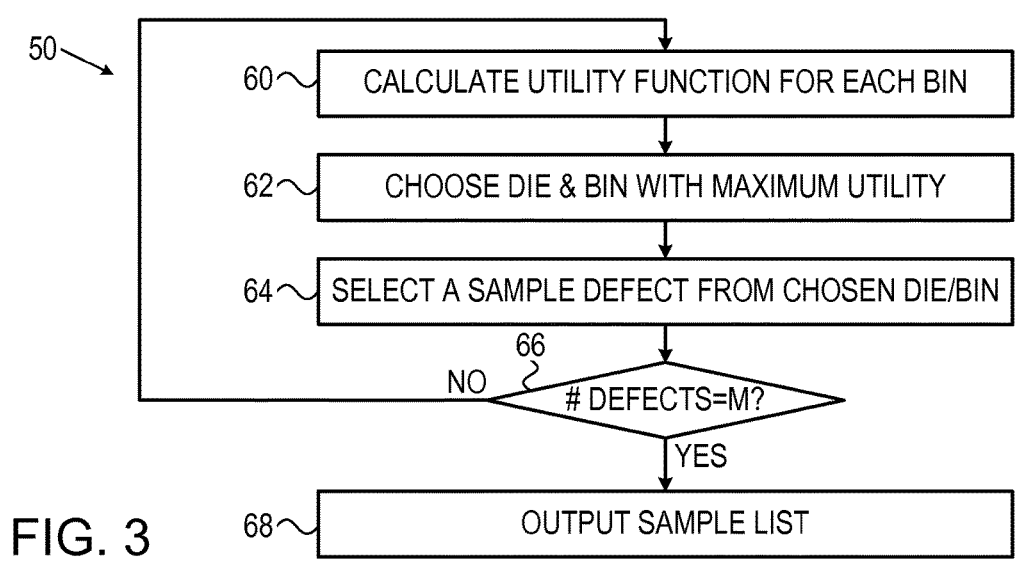
FIG. 3 is a flow chart that schematically illustrates a method for identifying sample defect bins for review, in accordance with an embodiment of the present invention.

FIG. 3 is a flow chart that schematically shows details of sampling step 50, in accordance with an embodiment of the present invention. As noted earlier, the method presented in FIG. 3 may be used, mutatis mutandis, in implementing re-sampling step 56. The key element in the method of FIG. 3 is calculation of a suitable utility function for each location (defined in terms of die and bin in the FEM) within the set of the locations that is under consideration, at a utility computation step 60. The utility function is indicative of the information content of the defect location, specifically as the information pertains to the values of the process parameters under evaluation. As mentioned earlier, this information can be derived from images or other attributes and parameters gathered from other sorts of inspection tools and machines.

In this regard, the inventors have found that a utility function based on the uncertainty of classification of the defects gives good results in choosing a group of sample images that are informative with respect to the bounds of the process window. Such a utility function U could have the form:

$$U = -\sum_{\omega_D=0,1} P(f(D) = \omega_D) \ln P(f(D) = \omega_D)$$

In this equation, P is a probability function taken over the classifier function f for the given die D, giving the probability that the die will be classified as being inside the process window ($\omega_D=0$) or outside the process window ($\omega_D=1$), given the classification of the current defect $x_s$. The probability P may take into account information gathered from various sources, such as defect images, a stepper machine, an inspection machine, a-priori knowledge of an expert, and previous analysis of the sorting step.

The utility function U can take various forms. For example, the utility can be based on the decision of a classifier, which indicates how likely any given defect is to be a defect of interest or a nuisance defect. Other methods that are known in the art, such as the generalized method of moments (GMM), hidden Markov models (HMM), support vector machines (SVM), entropy estimation, or ensembles of classifiers, may also be used in estimating the probability values and hence the utility functions. One set of functions that may be used for this purpose is presented below in Appendix A (although this is just one example of a function that exhibits suitable functional behavior). Alternative utility functions will be apparent to those skilled in the art after reading the present description and are considered to be within the scope of the present invention.

Returning to FIG. 3, after calculating the utility function for each defect location at step 60, processor 32 chooses the die/bin combination that has the highest value of utility, at a bin selection step 62. In other words, the processor finds argmax(U) and chooses the corresponding die $D_i$ and bin $B_j$. The processor selects a defect $x_s$ from this bin for inclusion in the set of samples that is to be passed on for further review, at a sample extraction step 64. Selection of a defect from a die with the highest utility is typically made according to a statistical analysis of the defect in an attribute space. Defects that have better chance of being defects of interest are chosen within the selected die. The sampling algorithm that is used at this step may be implemented as a look-ahead selective sampling method, as is known in the art, which optimizes the selection of defects with maximum utility by postulating the labels of certain dies as a result of future decisions.

The selected defect is now removed from the set of defects awaiting selection, and processor 32 checks whether the specified number of defects, M, to be output as sample defects have been selected, at a completion checking step 66. If the specified number of defects has not yet been reached, processor 32 returns to step 60 and recomputes the values of the utility function, taking the possible classifications of the defects already selected as a given. The processor then proceeds through steps 62 and 64 to select another defect until M defects have been collected. Upon finding that the Mth defect has been selected at step 66, processor 32 outputs the selected defects and their respective locations, at a sample output step 68. These samples are passed on for further review at step 52 or at step 58.

Figure 4:
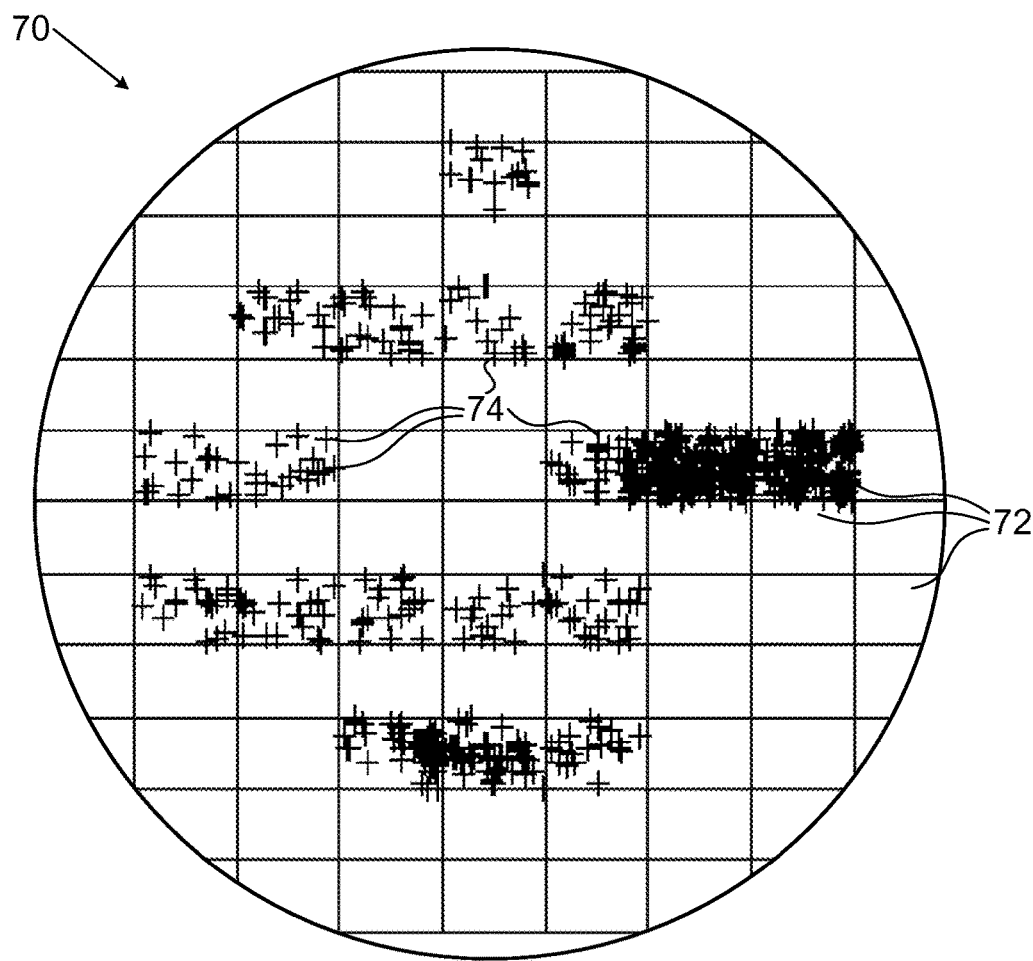
FIG. 4 is a schematic representation of a wafer map, in accordance with an embodiment of the present invention.

FIG. 4 is a schematic representation of a wafer map 70, illustrating the locations of selected defects, in accordance with an embodiment of the present invention. Map 70 is divided into a matrix of dies 72, corresponding to the dies of the FEM wafer. Sample bins, containing defects selected at step 50, are indicated by marks 74 in map 70. As can be seen in the figure, these sample bins are concentrated in certain dies, which were found in steps 48 and 50 to be most informative with respect to the process parameter settings.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

APPENDIX—UTILITY FUNCTION COMPUTATION

As noted earlier, a useful measure of the utility is:

$$U = -\sum_{\omega_D=0,1} P(f(D)=\omega_D) \ln P(f(D)=\omega_D)$$

Here $P(f(D)=\omega_D)$ is the probability of a die D to be labeled $\omega_D$ by a classifier $f$.

In the binary case $P(f(D)=1)=1-P(f(D)=0)$, and P is calculated as a variant of a K nearest neighbor classifier (KNN) based on the distance of the die D from the edge of the preliminary process window obtained in the sorting step, with respect to being inside or outside of the process window.

Taking r to be the distance of die D from the preliminary process window edge, P can then be calculated by the following equation:

$$P(f(D)=1)(r) = \frac{1}{2}(1-\tanh(\theta r)).$$

The parameter $\theta$ is determined based on statistical analysis of each bin regarding its contribution to the estimation of the preliminary process window. When a die is exactly on the edge $$P(f(D)=1)(r=0) = \frac{1}{2};$$

when a die is far from edge and outside the process window $P(f(D)=1)(r=\infty)=0$; and when a die is far from the edge but inside the process window $P(f(D)=1)(r=\infty)=1$.

In this manner, the utility function reaches a maximum at the edges of the preliminary process window and thus increases the sample rate of defects in those dies having high uncertainty in their label, as to whether they are in or out of the process window.

The invention claimed is:

1. A method comprising:
    acquiring, by a processor, first inspection data collected by using a first inspection modality during a first inspection process of a substrate having multiple instances of a pattern of features, wherein each of the instances of the pattern of features is formed by a fabrication process utilizing different respective sets of process parameters associated with the fabrication process of the substrate;
    identifying, by the processor, defects at locations in the instances of the pattern based on the first inspection data;
    analyzing, by the processor, characteristics of the defects identified in the first inspection data to select a first set of the locations at which the first inspection data is indicative of an influence of the process parameters associated with the fabrication process on the defects;
    responsive to selecting the first set of the locations, causing, by the processor, a second imaging modality to acquire second inspection data of the substrate at the first set of the locations during a second inspection process, wherein the second inspection modality corresponds to a finer resolution than the first inspection modality;
    analyzing, by the processor, one or more defects appearing in the second inspection data to select, from the first set of the locations, a second set of the locations at which the second inspection data is indicative of a range of the process parameters, wherein the process parameters comprise a focal adjustment and an exposure level applied in the fabrication process to form one or more of the instances of the pattern of features on the substrate; and
    providing the range of the process parameters for fabrication of a target device that is to include the pattern.

2. The method according to claim 1, wherein the first inspection modality is an optical imaging modality, and wherein the second inspection modality is an electron imaging modality.

3. The method according to claim 1, wherein the substrate corresponds to a semiconductor wafer, and wherein the fabrication process comprises lithographic patterning of the semiconductor wafer, and the instances of the pattern correspond to dies defined by the lithographic patterning.

4. The method according to claim 1, wherein analyzing the characteristics of the defects comprises:
clustering the defects into a plurality of bins corresponding to the locations of the defects in the instances of the pattern;
sorting the bins so as to prioritize the bins that are indicative of the influence of the process parameters on the defects; and
selecting the first set of the locations from among the prioritized bins.

5. The method according to claim 4, wherein clustering the defects comprises defining the bins responsively to respective features of the design occurring in the bins.

6. The method according to claim 4, wherein sorting the bins comprises:
identifying a correlation in one or more of the bins between changes in at least one of the process parameters and the defects in the one or more of the bins; and
prioritizing the one or more of the bins responsively to the identified correlation.

7. The method according to claim 1, wherein analyzing the characteristics of the defects comprises:
computing, for the defects, corresponding values of a utility function that are indicative of an information content of the first inspection data at the locations of the defects; and
selecting the first set of the locations in response to the computing of the corresponding values of the utility function.

8. A system comprising:
a memory; and
a processor, operatively coupled with the memory, to:
acquire first inspection data collected by using a first inspection modality during a first inspection process of a substrate having multiple instances of a pattern of features, wherein each of the instances of the pattern of features is formed by a fabrication process utilizing different respective sets of process parameters associated with the fabrication process of the substrate;
identify defects at locations in the instances of the pattern based on the first inspection data;
analyze characteristics of the defects identified in the first inspection data to select a first set of the locations at which the first inspection data is indicative of an influence of the process parameters associated with the fabrication process on the defects;
responsive to selecting the first set of the locations, cause a second imaging modality to acquire second inspection data of the substrate at the first set of the locations during a second inspection process, wherein the second inspection modality corresponds to a finer resolution than the first inspection modality;
analyze one or more defects appearing in the second inspection data to select, from the first set of the locations, a second set of the locations at which the second inspection data is indicative of a range of the process parameters, wherein the process parameters comprise a focal adjustment and an exposure level applied in the fabrication process to form one or more of the instances of the pattern of features on the substrate; and
provide the range of the process parameters for fabrication of a target device that is to include the pattern.

9. The system according to claim 8, wherein the first inspection modality is an optical imaging modality, and wherein the second inspection modality is an electron imaging modality.

10. The system according to claim 8, wherein the substrate corresponds to a semiconductor wafer, and wherein the fabrication process comprises lithographic patterning of the semiconductor wafer, and the instances of the pattern correspond to dies defined by the lithographic patterning.

11. The system according to claim 8, wherein the substrate is a focus/exposure matrix (FEM) wafer.

12. The system according to claim 8, wherein the processor is further to:
cluster the defects into a plurality of bins corresponding to the locations of the defects in the instances of the pattern, to sort the bins so as to prioritize the bins that are indicative of the influence of the process parameters on the defects; and
select the first set of the locations from among the prioritized bins.

13. The system according to claim 12, wherein the bins are defined responsively to respective features of the design occurring in the bins.

14. The system according to claim 12, wherein the processor is further to:
identify a correlation in one or more of the bins between changes in at least one of the process parameters and the defects in the one or more of the bins; and
prioritize the one or more of the bins responsively to the identified correlation.

15. The system according to claim 8, wherein the processor is further to:
compute, for the defects, corresponding values of a utility function that are indicative of an information content of the first inspection data at the locations of the defects; and
select the first set of the locations in response to the corresponding values of the utility function.

16. A non-transitory computer-readable medium storing instructions, which when executed by a processor, cause the processor to:
acquire first inspection data collected by using a first inspection modality during a first inspection process of a substrate having multiple instances of a pattern of features, wherein each of the instances of the pattern of features is formed by a fabrication process utilizing different respective sets of process parameters associated with the fabrication process of the substrate;
identify defects at locations in the instances of the pattern based on the first inspection data;
analyze characteristics of the defects identified in the first inspection data to select a first set of the locations at which the first inspection data is indicative of an influence of the process parameters associated with the fabrication process on the defects;
responsive to selecting the first set of the locations, cause a second imaging modality to acquire second inspection data of the substrate at the first set of the locations during a second inspection process, wherein the second inspection modality corresponds to a finer resolution than the first inspection modality;

analyze one or more defects appearing in the second inspection data to select, from the first set of the locations, a second set of the locations at which the second inspection data is indicative of a range of the process parameters, wherein the process parameters comprise a focal adjustment and an exposure level applied in the fabrication process to form one or more of the instances of the pattern of features on the substrate; and provide the range of the process parameters for fabrication of a target device that is to include the pattern.

\* \* \* \* \*